United States Patent
Cheng et al.

(10) Patent No.: US 8,766,363 B2
(45) Date of Patent: Jul. 1, 2014

(54) METHOD AND STRUCTURE FOR FORMING A LOCALIZED SOI FINFET

(71) Applicant: International Business Machines Corporation, Armonk, NY (US)

(72) Inventors: Kangguo Cheng, Schenectady, NY (US); Veeraraghavan S. Basker, Schenectady, NY (US); Bruce B. Doris, Albany, NY (US); Ali Khakifirooz, Mountain View, CA (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/670,768

(22) Filed: Nov. 7, 2012

(65) Prior Publication Data
US 2014/0124860 A1 May 8, 2014

(51) Int. Cl.
*H01L 27/12* (2006.01)
(52) U.S. Cl.
USPC 257/347; 257/255; 257/E21.09; 257/E27.062
(58) Field of Classification Search
USPC .............. 257/347, 255, E21.09, E27.062
See application file for complete search history.

(56) References Cited

U.S. PATENT DOCUMENTS

| | | | |
|---|---|---|---|
| 7,300,837 B2 | 11/2007 | Chen et al. | |
| 7,442,590 B2 | 10/2008 | Orlowski | |
| 7,807,517 B2 | 10/2010 | Kim et al. | |
| 7,879,677 B2 | 2/2011 | Lee | |
| 7,898,040 B2 | 3/2011 | Nawaz | |
| 7,923,337 B2 | 4/2011 | Chang | |
| 7,977,174 B2 | 7/2011 | Luning et al. | |
| 8,017,463 B2 | 9/2011 | Chang | |
| 8,258,577 B2 | 9/2012 | Dixit | |
| 2007/0158756 A1 | 7/2007 | Dreeskornfeld et al. | |
| 2008/0128797 A1 | 6/2008 | Dyer et al. | |
| 2009/0072276 A1* | 3/2009 | Inaba | 257/255 |
| 2009/0280626 A1* | 11/2009 | Zhu et al. | 438/479 |
| 2011/0097889 A1 | 4/2011 | Yuan et al. | |

FOREIGN PATENT DOCUMENTS

KR 10-2011-0010383 2/2011

OTHER PUBLICATIONS

International Search Report/Written Opinion, Nov. 26, 2013; Application No. US2013/055034.

* cited by examiner

*Primary Examiner* — Tan N Tran
(74) *Attorney, Agent, or Firm* — Howard M. Cohn; Matthew C. Zehrer

(57) ABSTRACT

Methods and structures for forming a localized silicon-on-insulator (SOI) finFET are disclosed. Fins are formed on a bulk substrate. Nitride spacers protect the fin sidewalls. A shallow trench isolation region is deposited over the fins. An oxidation process causes oxygen to diffuse through the shallow trench isolation region and into the underlying silicon. The oxygen reacts with the silicon to form oxide, which provides electrical isolation for the fins. The shallow trench isolation region is in direct physical contact with the fins and/or the nitride spacers that are disposed on the fins.

11 Claims, 10 Drawing Sheets

US 8,766,363 B2

1

METHOD AND STRUCTURE FOR FORMING A LOCALIZED SOI FINFET

FIELD OF THE INVENTION

The present invention relates generally to semiconductor fabrication, and more particularly to structures and methods for forming fin field effect transistors (FinFETs).

BACKGROUND OF THE INVENTION

With the continuing trend towards miniaturization of integrated circuits (ICs), there is a need for transistors to have higher drive currents with increasingly smaller dimensions. FinFET technology is becoming more prevalent as device size continues to shrink. Silicon-on-insulator (SOI) finFET devices have excellent electrical performance. However, the cost of manufacturing SOI finFETs can be high. Bulk finFETs, where there is no insulator film between the fins and the substrate, have a lower manufacturing cost as compared with a SOI finFET. However, bulk finFETs are prone to leakage currents which can degrade the electrical performance. It is therefore desirable to have improved methods and structures for implementation of finFET devices.

SUMMARY OF THE INVENTION

In one embodiment, a semiconductor structure is provided. The structure comprises a semiconductor substrate, a first fin disposed on the semiconductor substrate, an oxide region formed at the base of the first fin, and a shallow trench isolation region formed adjacent to, and in physical contact with the first fin at the base, wherein the shallow trench isolation region is below the level of the top of the first fin.

In another embodiment, a semiconductor structure is provided. The structure comprises a silicon substrate, a first fin disposed on the silicon substrate, having a top and a base, a second fin disposed on the silicon substrate, having a top and a base, wherein the top of the first fin and the top of the second fin are horizontally coplanar, wherein a portion of the silicon substrate comprises an oxidized region, and wherein the oxide region extends into the base of each fin, and wherein the distance between the oxide region and the top of the first fin is less than the distance between the oxide region and the top of the second fin.

In another embodiment, a method of forming a semiconductor structure is provided. The method comprises forming a fin on a bulk semiconductor substrate, depositing fin sidewall spacers on the fin, depositing a shallow trench isolation region in direct physical contact with the fin sidewall spacers and the bulk semiconductor substrate, performing an oxidation process to oxidize the base of the fin and a portion of the bulk semiconductor substrate, and performing a shallow trench isolation region recess.

In another embodiment, a method of forming a semiconductor structure is provided. The method comprises forming a first fin and a second fin on a bulk semiconductor substrate, depositing a mask region on the second fin, performing a first substrate recess adjacent to the first fin, removing the mask region, depositing sidewall spacers on the first fin and the second fin, depositing a shallow trench isolation region over the bulk semiconductor substrate, such that the shallow trench isolation region is in direct physical contact with the sidewall spacers, performing an oxidation process to oxidize the base of the first fin, the base of the second fin, and a portion

2 of the bulk semiconductor substrate, and performing a shallow trench isolation region recess.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
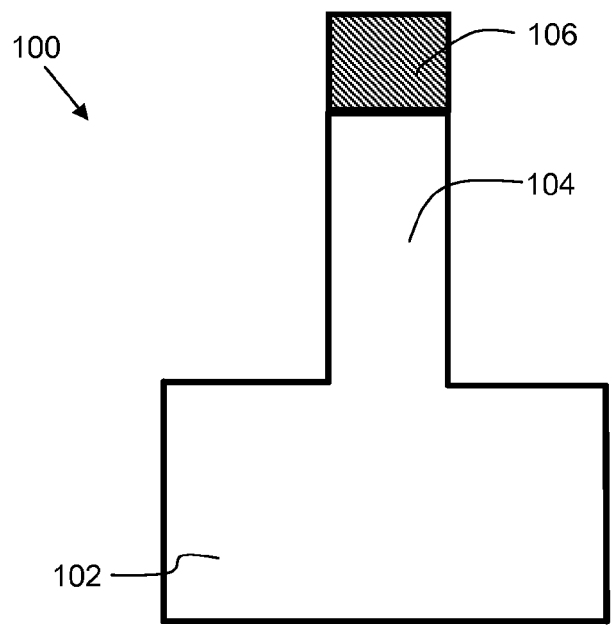

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 shows a semiconductor structure at a starting point for an embodiment of the present invention.

Figure 2:
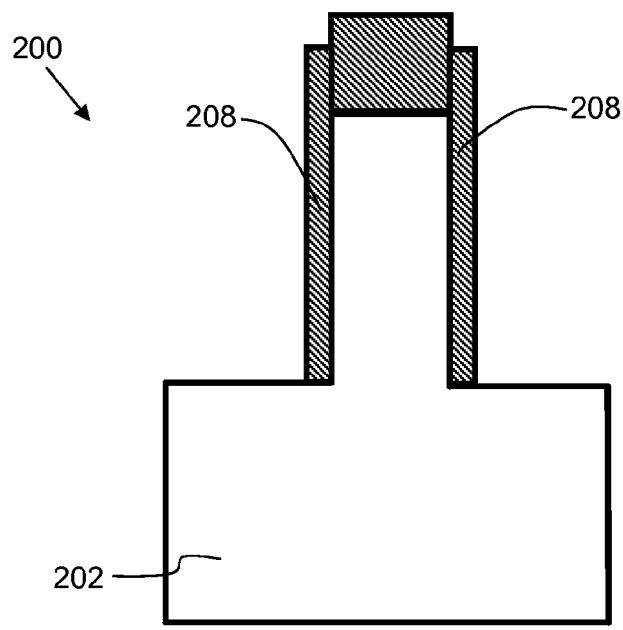

FIG. 2 shows a semiconductor structure after a subsequent processing step of depositing sidewall spacers.

Figure 3:
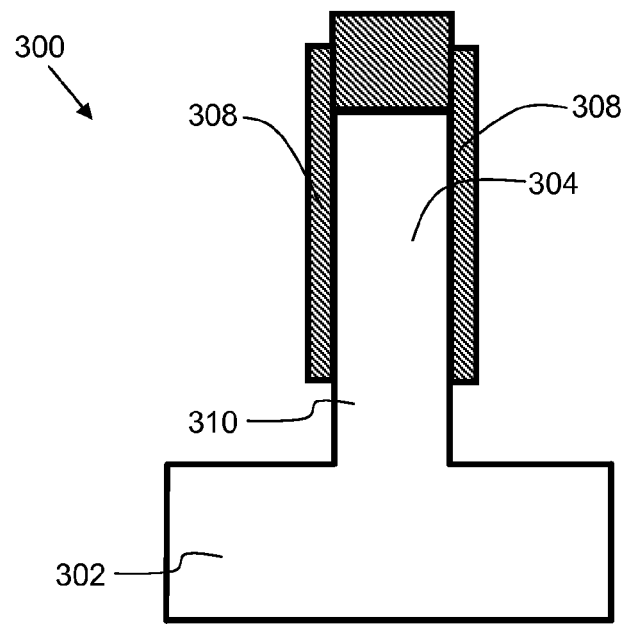

FIG. 3 shows a semiconductor structure after an optional subsequent processing step of performing a substrate recess.

Figure 4:
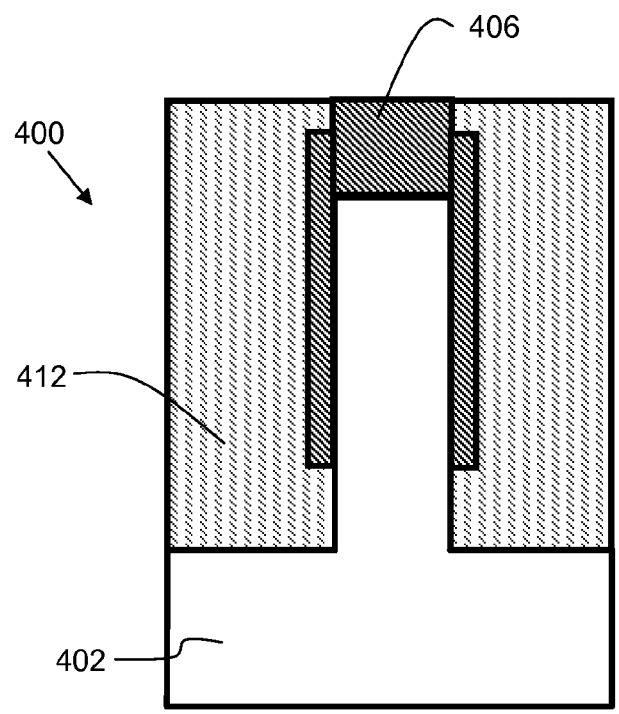

FIG. 4 shows a semiconductor structure after a subsequent processing step of depositing a shallow trench isolation region.

Figure 5:
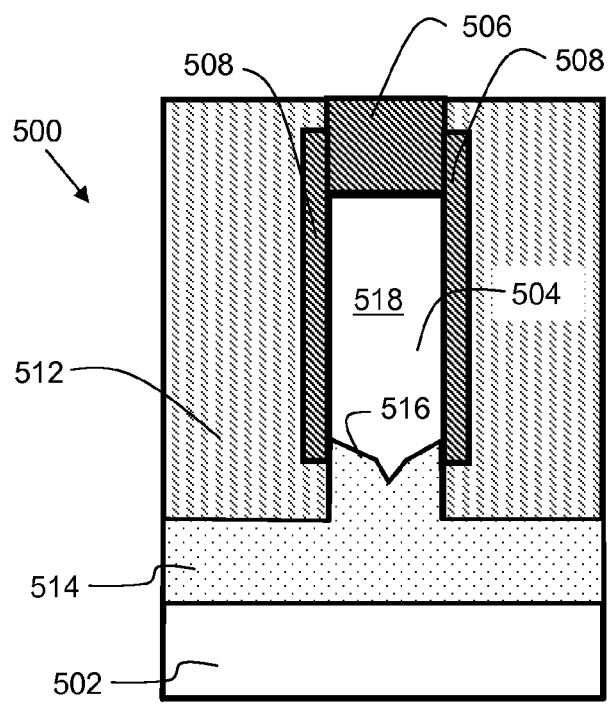

FIG. 5 shows a semiconductor structure after a subsequent processing step of performing an oxidation.

Figure 6:
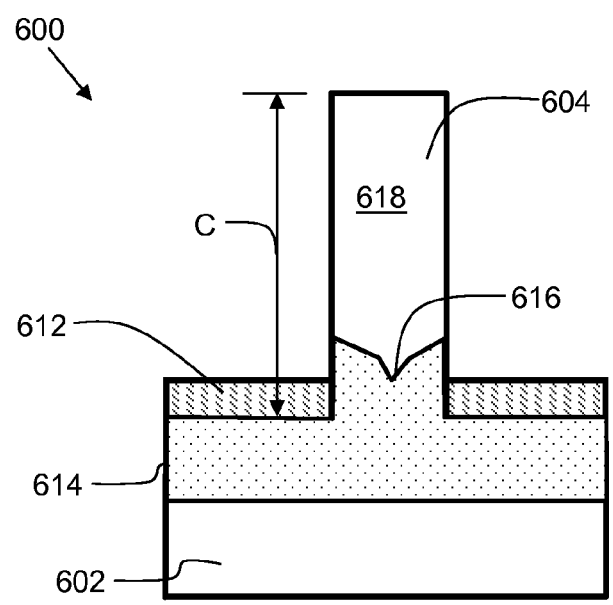

FIG. 6 shows a semiconductor structure after a subsequent processing step of removing spacers and the pad nitride layer.

Figure 7:
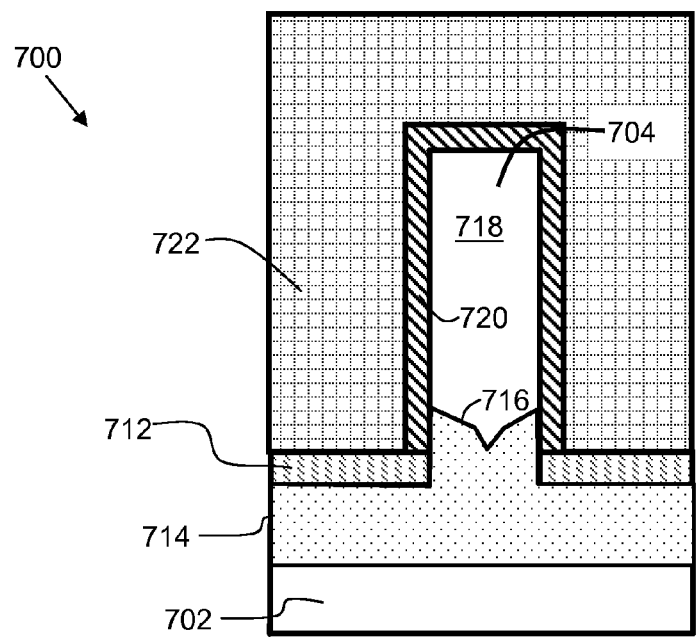

FIG. 7 shows a semiconductor structure in accordance with an embodiment of the present invention after the deposition of the gate dielectric and gate.

Figure 8:
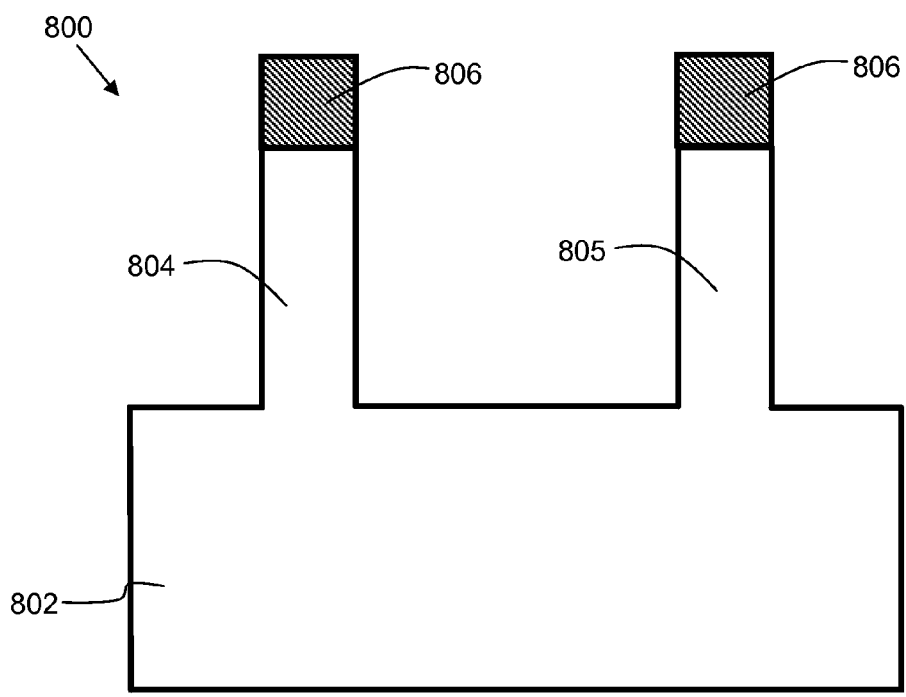

FIG. 8 is a semiconductor structure at a starting point for an additional embodiment of the present invention.

Figure 9:
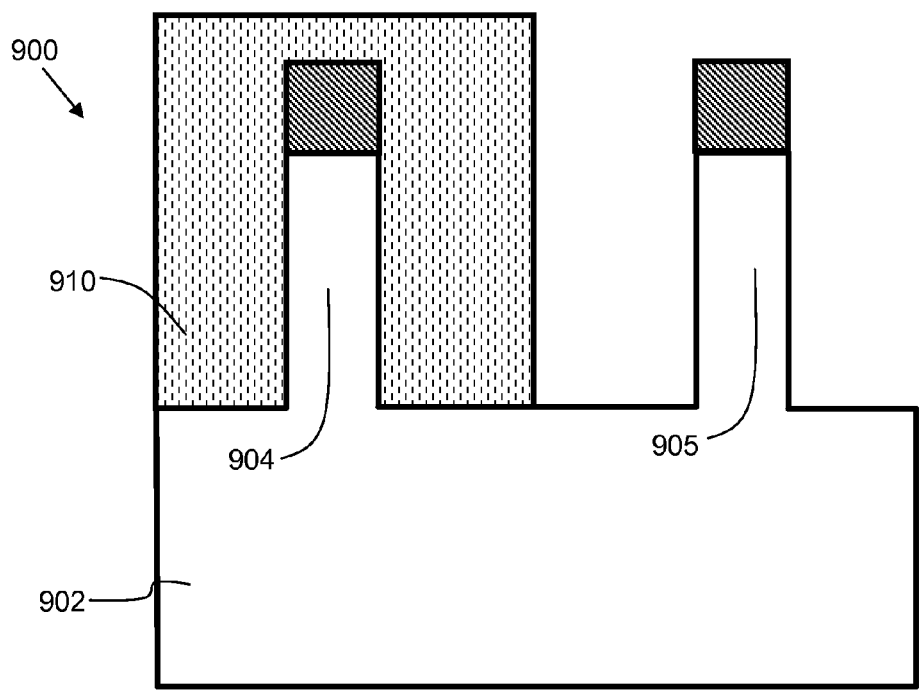

FIG. 9 is a semiconductor structure of the embodiment of FIG. 8 after a subsequent processing step of applying a mask layer.

Figure 10:
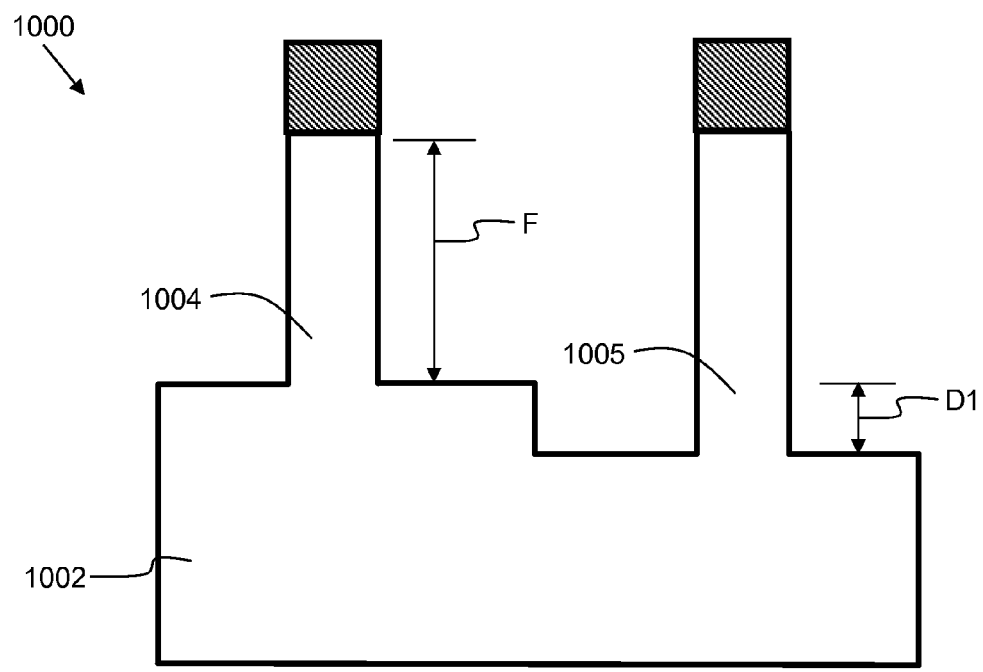

FIG. 10 is a semiconductor structure of the embodiment of FIG. 8 after subsequent processing steps of performing a substrate recess.

Figure 11:
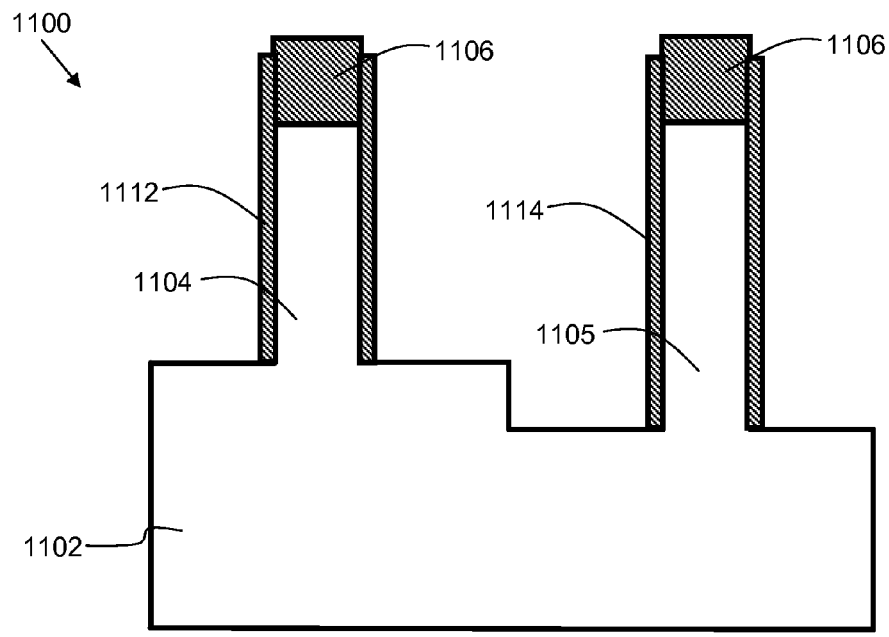

FIG. 11 is a semiconductor structure of the embodiment of FIG. 8 after a subsequent processing step of depositing fin sidewall spacers.

Figure 12:
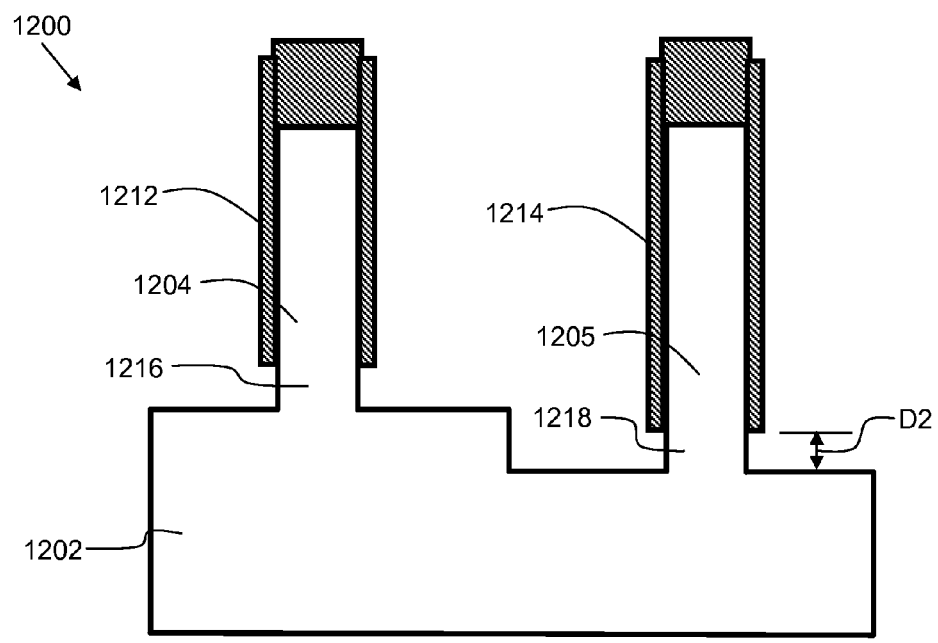

FIG. 12 is a semiconductor structure of the embodiment of FIG. 8 after a subsequent optional processing step of performing an additional substrate recess.

Figure 13:
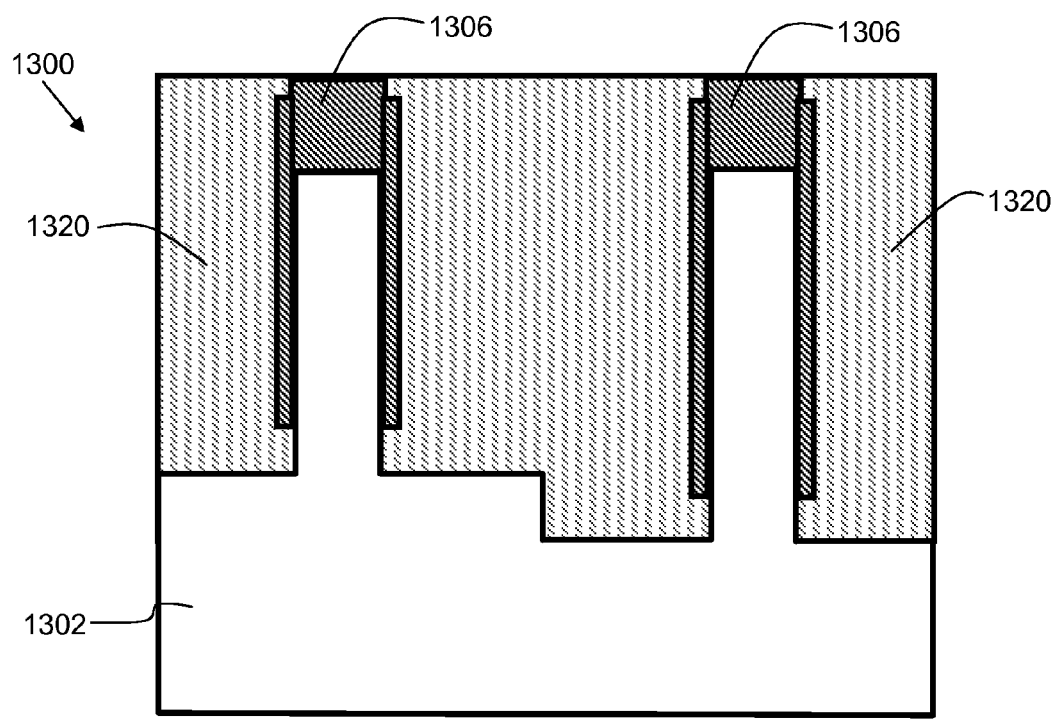

FIG. 13 is a semiconductor structure of the embodiment of FIG. 8 after a subsequent processing step of depositing a shallow trench isolation region.

Figure 14:
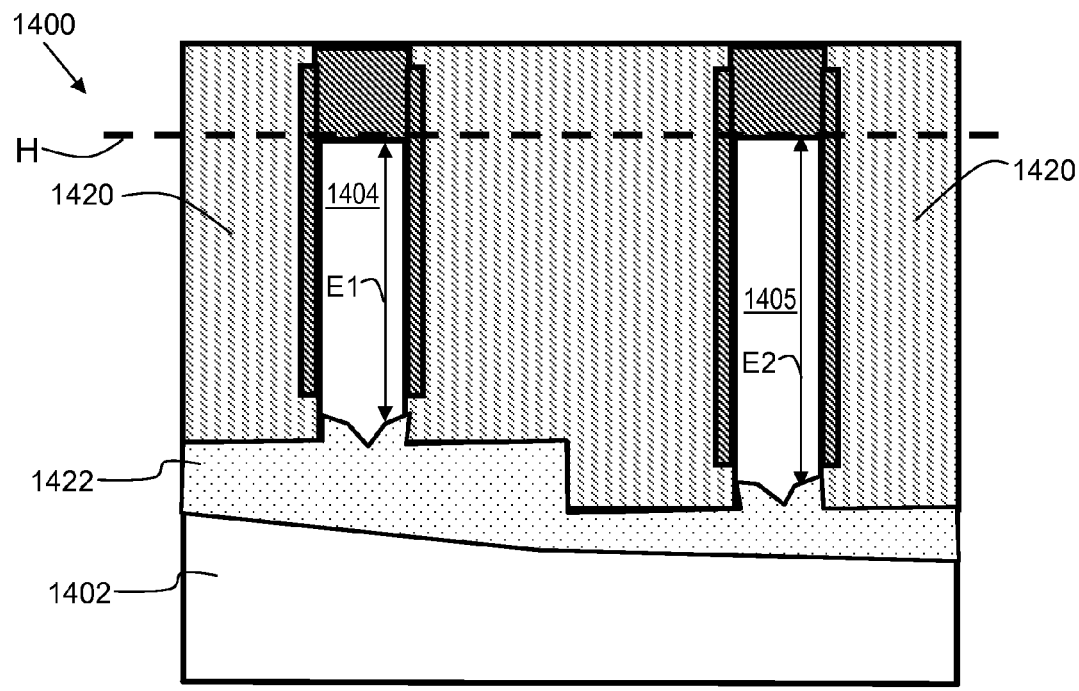

FIG. 14 is a semiconductor structure of the embodiment of FIG. 8 after a subsequent processing step of performing an oxidation.

Figure 15:
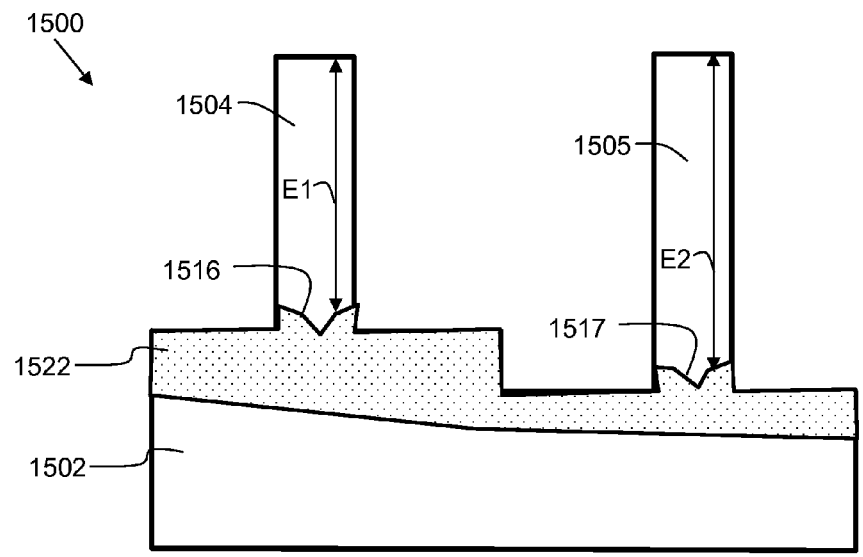

FIG. 15 is a semiconductor structure of the embodiment of FIG. 8 after subsequent processing steps of removing spacers and the pad nitride layer.

Figure 16:
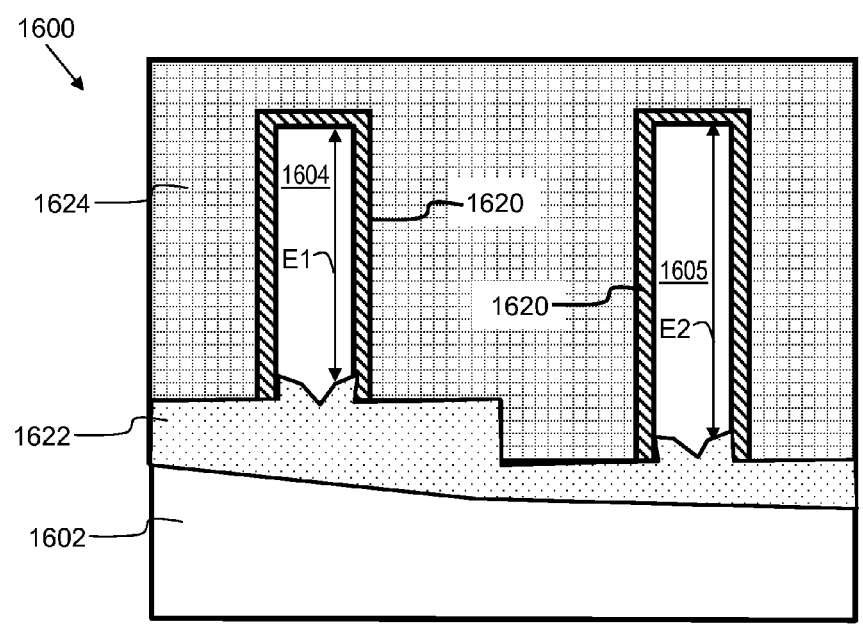

FIG. 16 is a semiconductor structure in accordance with an embodiment of the present invention after the deposition of the gate dielectric and gate.

Figure 17:
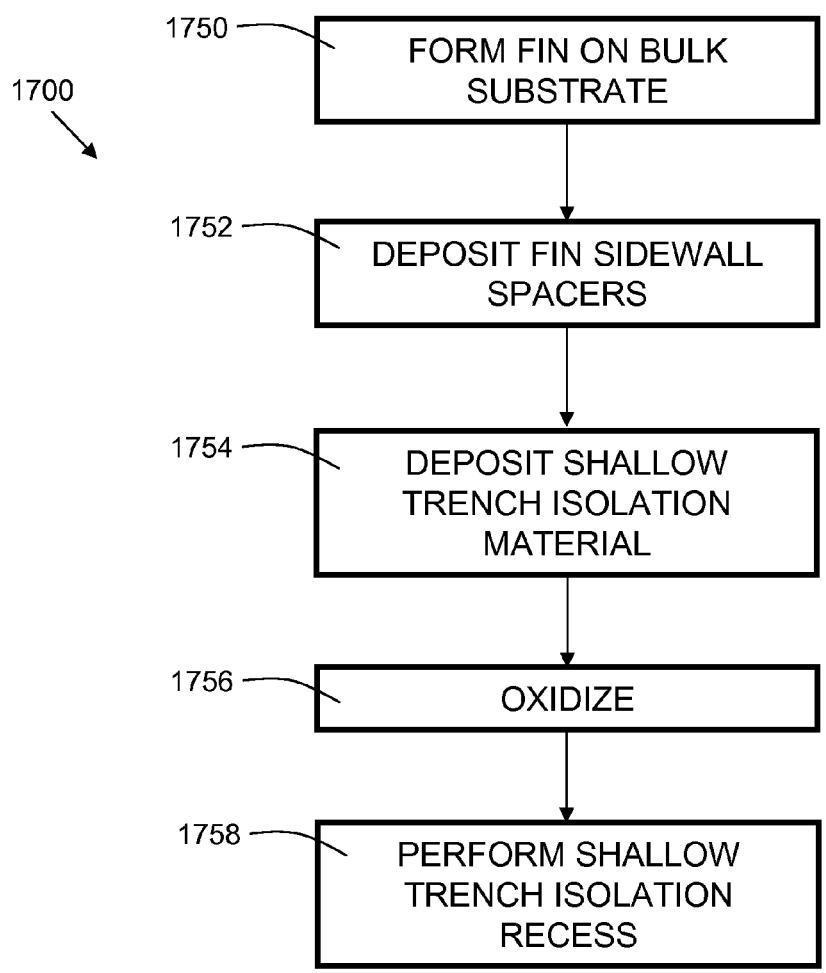

FIG. 17 is a flowchart indicating process steps for embodiments of the present invention.

Figure 18:
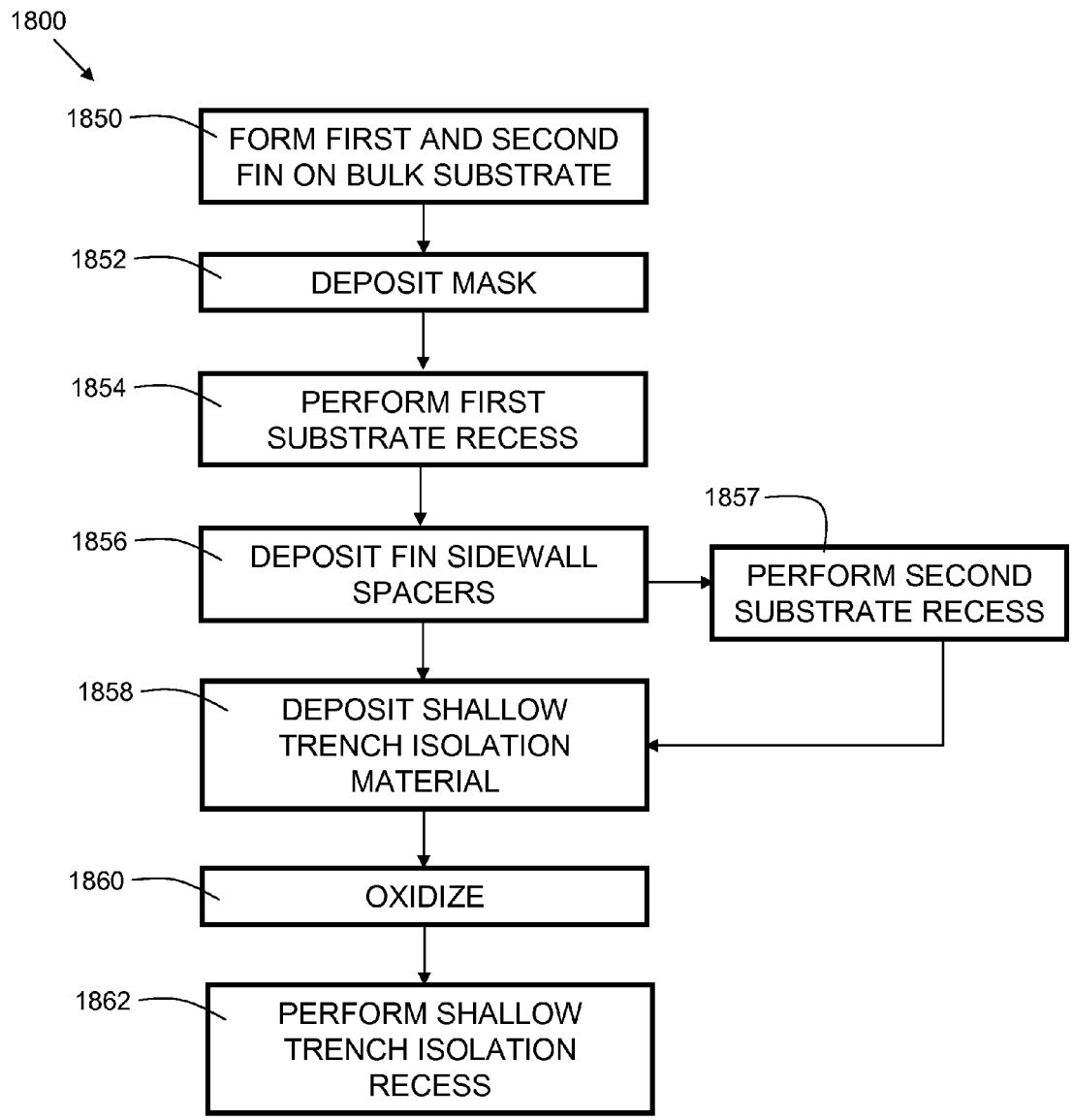

FIG. 18 is a flowchart indicating process steps for additional embodiments of the present invention.

DETAILED DESCRIPTION

FIG. 1 shows a semiconductor structure 100 at a starting point for an embodiment of the present invention. A bulk semiconductor substrate 102 forms the base of semiconductor structure 100. Bulk substrate 102 may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. Using industry-standard deposition and patterning techniques, a fin 104 is formed in the bulk substrate 102. A pad nitride layer 106 is disposed on top of fin 104. Note that for the sake of illustrative simplicity, only one fin 104 is shown. However, in practice, there may be multiple fins formed on substrate 102.

FIG. 2 shows a semiconductor structure 200 after a subsequent processing step of depositing fin sidewall spacers 208. As stated previously, similar elements may be referred to by similar numbers in various figures (FIGs) of the drawing, in which case typically the last two significant digits may be the same. For example, bulk substrate 202 of FIG. 2 is similar to bulk substrate 102 of FIG. 1. The fin sidewall spacers 208 may be comprised of nitride.

FIG. 3 shows a semiconductor structure 300 after an optional subsequent processing step of performing a substrate recess. The substrate recess may be performed by any suitable technique, such as a reactive ion etch, chemical downstream etch, wet etch, or any other suitable etch technique. As a result of the substrate etch, the top surface of substrate 302 is lower than that of structure 200 of FIG. 2, exposing a lower portion of the fin 310 which is not covered by spacers 308.

FIG. 4 shows a semiconductor structure 400 after a subsequent processing step of depositing a shallow trench isolation region 412. The shallow trench isolation (STI) region 412 may be comprised of silicon oxide. Optionally, the shallow trench isolation region 412 may be planarized to the level of the pad nitride 406. The planarization may be performed via a chemical mechanical polish process.

FIG. 5 shows a semiconductor structure 500 after a subsequent processing step of performing an oxidation. The oxidation process may be a thermal oxidation process. In some embodiments, the oxidation occurs in a furnace set to a temperature in the range of 900 degrees Celsius to 1300 degrees Celsius. Oxygen in the furnace diffuses through the shallow trench isolation region to react with the silicon of the substrate 502, forming oxide region 514, which includes oxide region 516 formed at the base of the fin 504, leaving unoxided portion 518 of the fin. Oxide region 516 has a "V-shaped" or "tail" profile, in which the oxide region is higher near the exterior of the fin, and lower near the interior of the fin. During the oxidation process, mechanical stress can be imparted to the fin 504, due to volume expansion of the oxide as compared with silicon. Normally, this could cause the fin to mechanically shift or tilt, relative to the horizontal, such that the fin would no longer be perpendicular to the substrate 502. However, due to embodiments of the present invention, the shallow trench isolation region 512, being in direct physical contact with the fin 504 and fin sidewall spacers 508, the fin 504 is held firmly in place by the shallow trench isolation region 512 during the formation of oxide regions 514 and 516, and so the undesirable mechanical shift is prevented.

FIG. 6 shows a semiconductor structure 600 after a subsequent processing step of removing spacers and the pad nitride layer (compare with 506 and 508 of FIG. 5). The shallow trench isolation region is then recessed. A portion of the shallow trench isolation region 612 may remain after the recess. The fin 604 has a fin height C. In some embodiments, the fin height C ranges from about 20 nanometers to about 150 nanometers. In some embodiments, the shallow trench isolation region 612 has a height ranging from about 0.2 times the height of the fin to about 2 times the height of the fin. Optionally, the entire shallow trench isolation may be removed.

FIG. 7 shows a semiconductor structure 700 in accordance with an embodiment of the present invention after the deposition of the gate dielectric 720 and gate region 722. The semiconductor structure 700 comprises a semiconductor substrate 702. A fin 704 is disposed on the semiconductor substrate 702. An oxide region 716 is formed at the base of the fin 704, while unoxided fin portion 718 is above the oxide region 716. Oxide region 716 and 714 serve as a dielectric isolation for the fin 704. The gate dielectric 720 is disposed over the fin 704. In some embodiments, gate dielectric layer 720 may include but is not limited to: hafnium silicate (HfSiO), hafnium oxide (HfO2), zirconium silicate (ZrSiOx), zirconium oxide (ZrO2), silicon oxide (SiO2), silicon nitride (Si3N4), silicon oxynitride (SiON), or any other high-k material (k>4.0) or any combination of these materials. In some embodiments, the thickness of the gate dielectric 720 ranges from about 5 angstroms to about 30 angstroms.

A gate region 722 is disposed over the gate dielectric layer 720. In some embodiments, gate region 722 is comprised of polysilicon. In other embodiments, gate region 722 is a replacement metal gate (RMG), and may be comprised of a metal such as aluminum, titanium nitride (TiN) or ruthenium (Ru) for a pFET, or titanium aluminum (TiAl), aluminum nitride (AlN) or tantalum carbide (TaC) for an nFET. Semiconductor structure 700 can therefore implement a finFET which has the performance of a silicon-on-insulator (SOI) finFET, without the cost associated with a silicon-on-insulator (SOI) finFET fabricated with blanket oxide deposition FIG. 8 is a semiconductor structure 800 at a starting point for an additional embodiment of the present invention. A bulk semiconductor substrate 802 forms the base of semiconductor structure 800. Bulk substrate 802 may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. Using industry-standard deposition and patterning techniques, a fin 804 and another fin 805 are formed in the bulk substrate 802. A pad nitride layer 806 is disposed on top of fin 804 and fin 805. Note that for the sake of illustrative simplicity, only two fins 804 and 805 are shown. However, in practice, there may be multiple fins formed on substrate 802. In the description that follows, there is different processing for the two fins at certain phases of the fabrication process. Those skilled in the art will recognize that in practice, there may be multiple fins, where the fins are divided into different groups which may receive the different processing at certain phases of the fabrication process.

FIG. 9 is a semiconductor structure 900 of the embodiment of FIG. 8 after a subsequent processing step of applying a mask layer 910. The mask layer may be applied using industry-standard deposition and patterning techniques. The mask layer 910 is applied over fin 904, while fin 905 is exposed, and not covered by mask layer 910.

FIG. 10 is a semiconductor structure 1000 of the embodiment of FIG. 8 after subsequent processing steps of performing a substrate recess to a depth of D1, and then removing the mask (compare with 910 of FIG. 9). As a result of the substrate recess, the top surface of substrate 1002 is lower in the area adjacent to fin 1005, which was not covered by the mask layer (910 of FIG. 9). In some embodiments, depth D1 may be in the range of about 5 nanometers to about 40 nanometers. Hence, as a result of the substrate etch, fin 1004 has a fin length of F, which is the original fin length, and fin 1005 has a fin length of F+D1.

FIG. 11 is a semiconductor structure 1100 of the embodiment of FIG. 8 after a subsequent processing step of depositing fin sidewall spacers. Fin 1104 has fin spacers 1112, and fin 1105 has fin spacers 1114. Fin spacers 1114 are longer than fin spacers 1112 due to the recess of the substrate 1102 in the area near fin 1105.

FIG. 12 is a semiconductor structure 1200 of the embodiment of FIG. 8 after a subsequent optional processing step of performing an additional substrate recess to a depth D2. This recess applies to the entire structure 1200, hence both fin 1204 and fin 1205 are subject to this recess. In some embodiments, depth D2 may be in the range of about 5 nanometers to about 100 nanometers. As a result of this substrate recess, an unexposed base portion 1216 of fin 1204 is formed below the spacers 1212. Similarly, an unexposed base portion 1218 of fin 1205 is formed below the spacers 1214.

FIG. 13 is a semiconductor structure 1300 of the embodiment of FIG. 8 after a subsequent processing step of depositing a shallow trench isolation region 1320. The shallow trench isolation region 1320 may be comprised of silicon oxide. Optionally, the shallow trench isolation region 1320 may be planarized to the level of the pad nitride 1306. The planarization may be performed via a chemical mechanical polish process.

FIG. 14 is the semiconductor structure of the embodiment of FIG. 8 after a subsequent processing step of performing an oxidation. The oxidation process may be a thermal oxidation process. In some embodiments, the oxidation occurs in a furnace set to a temperature in the range of 900 degrees Celsius to 1300 degrees Celsius. Oxygen in the furnace diffuses through the shallow trench isolation region to react with the silicon of the substrate 1402, forming oxide region 1422 which provides electrical isolation for fin 1404 and fin 1405. Both fin 1404 and fin 1405 are horizontally coplanar at the fin tops, and have the same physical height, terminating at level H. The horizontal coplanarity simplifies downstream processing steps, such as planarization processes. However, fin 1404 and fin 1405 have different electrical heights, which provided improved design flexibility. The electrical height is the length of the unoxided portion of the fin. Hence, fin 1404 has an electrical fin height of E1, whereas fin 1405 has an electrical fin height of E2, where E1<E2, and the physical height of both fins are at level H. Maintaining both fins at the identical physical height improves planarity issues, and simplifies downstream processing steps, while the different electrical heights of each fin give a circuit designer flexibility for designing finFETs with different electrical characteristics on the same semiconductor structure.

FIG. 15 is a semiconductor structure 1500 of the embodiment of FIG. 8 after subsequent processing steps of removing spacers and the pad nitride layer (compare with 1106, 1112, and 1114 of FIG. 11). Oxide region 1516 and oxide region 1517, located in the base of their respective fins, have a "V-shaped" or "tail" profile, in which the oxide region is higher near the exterior of the fin, and lower near the interior of the fin.

FIG. 16 is a semiconductor structure 1600 in accordance with an embodiment of the present invention after the deposition of the gate dielectric 1620 and gate region 1624. Semiconductor structure 1600 comprises fin 1604 and fin 1605. Fin 1604 and fin 1605 are coplanar at the fin tops. Oxide region 1622 provides dielectric isolation for fin 1604 and fin 1605. Fin 1604 has an electrical height E1 and fin 1605 has an electrical height E2. The electrical height is the length of the unoxided portion of each fin. Hence, fin 1604 has a shorter electrical height E1 than electrical fin height E2 of fin 1605. In embodiments, fin 1604 has an electrical fin height E1 ranging from about 70 nanometers to 150 nanometers, and fin 1605 has an electrical fin height E2 ranging from about 40 nanometers to about 120 nanometers.

FIG. 17 is a flowchart 1700 indicating process steps for embodiments of the present invention. In process step 1750, a fin is formed on a bulk substrate (see 104 of FIG. 1). In process step 1752, fin spacers are deposited on the fin sidewalls (see 208 of FIG. 2). In process step 1754, shallow trench isolation (STI) material is deposited on the structure (see 412 of FIG. 4). In process step 1756, an oxidation process is performed, resulting in oxidation regions (see 514 of FIG. 5). In process step 1758, the shallow trench isolation material is recessed (see 612 of FIG. 6).

FIG. 18 is a flowchart 1800 indicating process steps for additional embodiments of the present invention. In process step 1850, a first fin and second fin are formed on a bulk substrate (see 804 and 805 of FIG. 8). In process step 1852, a mask is deposited over one fin (see 910 of FIG. 9). Note that in practical embodiments, the mask is deposited over multiple fins comprising a group of fins. In process step 1854, a first substrate recess is performed (see D1 of FIG. 10). In process step 1856, fin sidewall spacers are deposited (see 1112 and 1114 of FIG. 11). In process step 1857, optionally, a second substrate recess is performed (see D2 of FIG. 12). The second recess serves to expose a portion of the fin at the base so it can be oxidized in an upcoming process step. In process step 1858, shallow trench isolation material is deposited (see 1320 of FIG. 13). In process step 1860, an oxidation process is performed, resulting in oxidation regions (see 1422 of FIG. 14). In process step 1862, the shallow trench isolation material is recessed (see 1500 of FIG. 15).

Embodiments of the present invention provide for methods and structures for forming a localized silicon-on-insulator (SOI) finFET. Fins are formed on a bulk substrate. Nitride spacers protect the fin sidewalls. A shallow trench isolation region is deposited over the fins. An oxidation process causes oxygen to diffuse through the shallow trench isolation region and into the underlying silicon. The oxygen reacts with the silicon to form oxide, which provides electrical isolation for the fins. The shallow trench isolation region is in direct physical contact with the fins and/or the nitride spacers that are disposed on the fins. This stabilizes the fins and prevents fin tilt due to oxidation-induced stress that occurs as a result of the oxidation process.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A semiconductor structure comprising:
a semiconductor substrate;
a first fin disposed on the semiconductor substrate;
an oxide region formed at a base of the first fin; and
a shallow trench isolation region formed adjacent to, and in physical contact with the first fin at the base, wherein the shallow trench isolation region is below a level of a top of the first fin; and further comprising a gate dielectric layer disposed over the first fin, wherein the first fin comprises an oxide region at the base of the first fin, wherein the oxide region has a V-shaped profile.

2. The structure of claim 1, further comprising a gate region disposed over the gate dielectric layer.

3. The structure of claim 2, wherein the gate dielectric layer is comprised of hafnium oxide.

4. The structure of claim 2, wherein the gate region is comprised of polysilicon.

5. The structure of claim 2, wherein the gate region is comprised of metal.

6. The structure of claim 1, wherein the shallow trench isolation region is comprised of silicon oxide.

7. The structure of claim 1, wherein the shallow trench isolation region has a height ranging from about 0.2 times the height of the first fin to about 2 times the height of the first fin.

8. The structure of claim 1, further comprising a second fin, wherein the second fin has a physical height identical to the physical height of the first fin, and wherein the second fin has an electrical height that is less than the electrical height of the first fin.

9. The structure of claim 8, wherein the first fin and second fin are coplanar at the top of each fin.

10. The structure of claim 1, wherein the gate dielectric layer has a thickness ranging from about 5 angstroms to about 20 angstroms.

11. The structure of claim 8, wherein the first fin has an electrical fin height ranging from about 70 nanometers to about 150 nanometers, and wherein the second fin has an electrical fin height ranging from about 40 nanometers to about 120 nanometers.

* * * * *